(12) United States Patent
Lee et al.

(10) Patent No.: US 8,067,697 B2
(45) Date of Patent: Nov. 29, 2011

(54) FLEXIBLE PRINTED CIRCUIT BOARD FOR LIGHT EMITTING DIODE BACKLIGHT UNIT AND METHOD OF FABRICATING THE SAME

(75) Inventors: Rok-hee Lee, Seoul (KR); Geun-woo Lee, Gyeonggi-do (KR); Koo-hwa Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 274 days.

(21) Appl. No.: 12/580,598

(22) Filed: Oct. 16, 2009

(65) Prior Publication Data

US 2010/0165657 A1    Jul. 1, 2010

(30) Foreign Application Priority Data

Dec. 29, 2008   (KR) ........................ 10-2008-0135875

(51) Int. Cl.
*H05K 1/00* (2006.01)

(52) U.S. Cl. ........ 174/254; 174/253; 174/262; 361/751; 257/99; 257/698; 257/737; 349/39; 349/48; 29/848; 29/852; 438/106; 438/149

(58) Field of Classification Search .................. 174/254, 174/253, 262; 361/517; 257/99, 698, 737; 349/39, 48; 29/848, 852; 438/106, 149
See application file for complete search history.

*Primary Examiner* — Xiaoliang Chen
(74) *Attorney, Agent, or Firm* — Morgan, Lewis & Bockius LLP (57) ABSTRACT

A flexible printed circuit board (PCB) for a light emitting diode backlight unit includes a flexible base film; a plurality of metal lines on a first surface of the flexible base film; a cover layer on the metal lines and covering a center portion of the first surface of the flexible base film; a first gold-plating pattern on the metal lines and at both ends of the first surface of the flexible base film; a metal pattern on a second surface of the flexible base film and including a first sub-pattern at one end of the second surface, a second sub-pattern at the other end of the second surface and a plurality of third-sub patterns between the first and second sub-patterns of the metal pattern; and a second gold-plating pattern on the metal pattern and including a fourth sub-pattern on the first sub-pattern, a fifth sub-pattern on the second sub-pattern, and a plurality of sixth-sub patterns each on the third sub-patterns, wherein a first groove between a first double-layered pattern of the first sub-pattern and the fourth sub-pattern and a second double-layered pattern of the third sub-pattern and the sixth sub-pattern, a second groove between a third double-layered pattern of the second sub-pattern and the fifth sub-pattern and a second double-layered pattern of the third sub-pattern and the sixth sub-pattern, and a third groove between adjacent second double-layered patterns respectively expose a portion of the second surface of the flexible base film.

15 Claims, 7 Drawing Sheets

FLEXIBLE PRINTED CIRCUIT BOARD FOR LIGHT EMITTING DIODE BACKLIGHT UNIT AND METHOD OF FABRICATING THE SAME

The present application claims the benefit of Korean Patent Application No. 10-2008-0135875 filed in Korea on Dec. 29, 2008, which is hereby incorporated by reference.

BACKGROUND OF THE INVENTION

1. Field of the Invention

The present invention relates to a backlight unit for a liquid crystal display (LCD) device and more particularly to a flexible printed circuit board (PCB) for a light emitting diode (LED) backlight unit and a method of fabricating the same.

2. Discussion of the Related Art

As the society has entered in earnest upon an information age, flat panel display devices, which have excellent capabilities of a thin profile, light weight and low power consumption, and so on, are introduced. For example, the flat panel display devices include an LCD device, a plasma display panel (PDP) device, an electroluminescent display (EL) device and a field emission display (FED) device.

Among these devices, LCD devices are widely used for notebook computers, monitors, TV, and so on instead of a cathode ray tube (CRT), because of their high contrast ratio and characteristics adequate to display moving images. The LCD device is not a self-emission type. Accordingly, the LCD device requires an additional light source. A backlight unit including a light source, for example, an LED, is disposed under a liquid crystal panel of the LCD device such that light from the backlight unit is provided onto the liquid crystal panel to display images.

Generally, the LCD device includes the liquid crystal panel, the backlight unit, a main frame, a bottom frame and a top frame. The liquid crystal panel is a main element for displaying images. The liquid crystal panel includes an array substrate, a color filter substrate and a liquid crystal layer therebetween. A PCB is disposed on edges of the array substrate. The PCB is connected to a gate pad and a data pad on the array substrate via a flexible printed circuit (FPC) or a chip on film (COF).

When the LED is used for the light source of the backlight unit, a rigid PCB, where the LED is disposed, and a flexible PCB for connecting the LED to a driving circuit board are required. The backlight unit including the LED as a light source may be called as an LED backlight unit. An integrated circuit board without the flexible PCB may be used for the LCD backlight unit. However, for considering production costs, two PCB, e.g., the rigid PCB and the flexible PCB, connected to each other are used.

First and second polarizing plates are formed on outer sides of the liquid crystal panel, respectively. The backlight unit is disposed under the liquid crystal panel such that one of the first and second polarizing plates is positioned between the liquid crystal panel and the backlight unit. The backlight unit includes a light source along at least one side of the main frame, a reflective sheet on the bottom frame, a light guide plate on the reflective sheet, and a plurality of optical sheets over the light guide plate. A light source guide member may be further included to guide the light source.

The liquid crystal display panel and the backlight unit are combined using the main frame that can prevent movement of the liquid crystal panel and the backlight unit. The main frame having a panel guide and four corners of the liquid crystal panel is positioned on the panel guides such that movement of the liquid crystal panel is prevented. The top frame cover edges of the liquid crystal panel and sides of the main frame, so the top frame can support and protect of the edges of the liquid crystal panel and sides of the main frame. The bottom frame covers back edges of the main frame, so the bottom frame is combined with the main frame and the top frame for modulation.

The light from the light source of the backlight unit is processed to have a uniform brightness through the light guide plate and the optical sheets and provided onto the liquid crystal panel.

Figure 1:
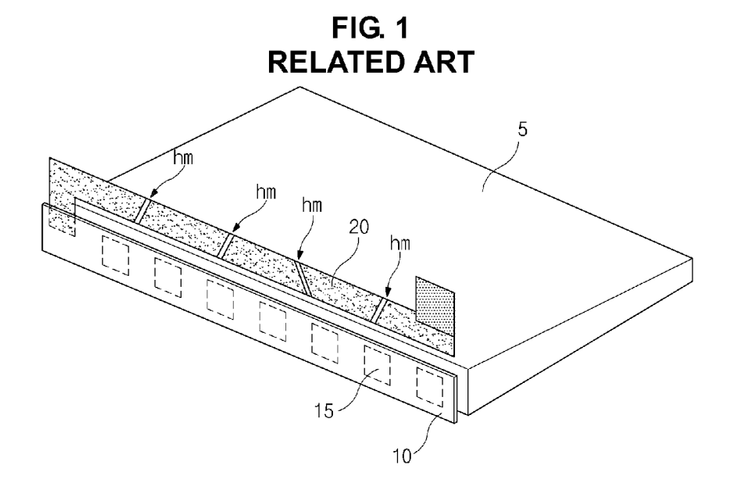
FIG. 1 is a view illustrating an LED backlight unit according to the related art.

FIG. 1 is a view illustrating an LED backlight unit according to the related art. In FIG. 1, the backlight unit includes a plurality of LEDs 15, a light guide plate 5, a reflective sheet (not shown) and optical sheets (not shown). The LEDs 15 are positioned at a side of the light guide plate 5. The LEDs 15 is attached on a rigid PCB 10. A flexible PCB 20 is attached to the rigid PCB 10. Namely, an end of the flexible PCB is boned onto one side of the rigid PCB 10.

Figure 2:
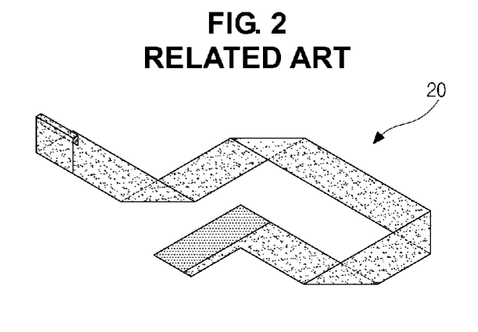
FIG. 2 is a view illustrating a flexible PCB in a bent condition.

Referring to FIG. 2, the flexible PCB 20 is bent at least once and positioned under the backlight unit (not shown). One end of the flexible PCB 20 is connected to the rigid PCB 10 (of FIG. 1), and the other end of the flexible PCB 20 is connected to an external driving circuit for driving the LEDs 15 (of FIG. 1).

Figure 3:
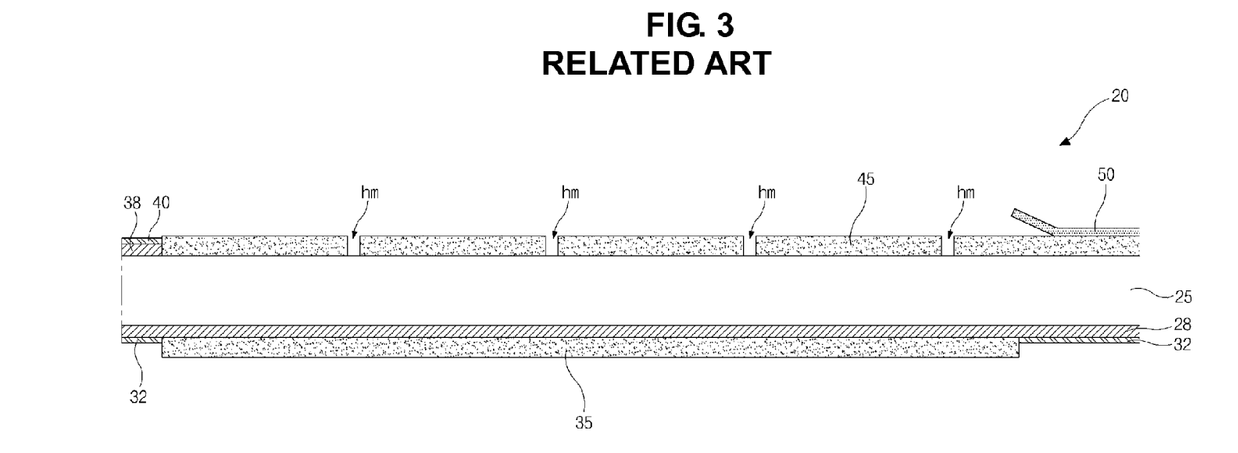
FIG. 3 is a cross-sectional view of a flexible PCB according to the related art.
Figure 4:
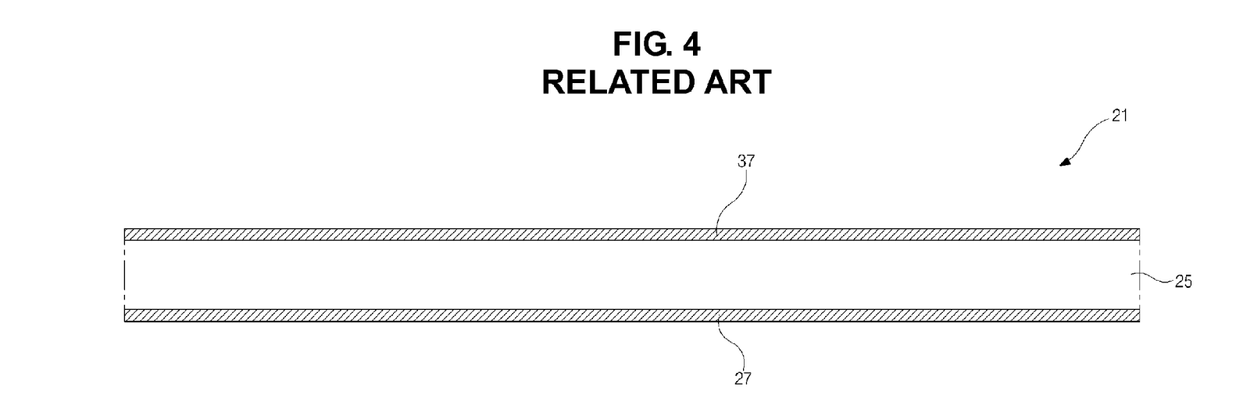
FIG. 4 is a cross-sectional view of a raw flexible board for a flexible PCB according to the related art.

FIG. 3 is a cross-sectional view of a flexible PCB according to the related art, and FIG. 4 is a cross-sectional view of a raw flexible board for a flexible PCB according to the related art.

Referring to FIG. 3, the flexible PCB 20 includes a flexible base film 25, a plurality of copper lines 28, a first gold-plating pattern 32, a first cover layer 35, a copper pattern 38, a second gold-plating pattern 40, a second cover layer 45 and a kapton tape 50. The kaptone tape 50 may be called as a polyimide tape. As mentioned above, one end of the flexible PCB 20 is connected to the rigid PCB, where the LEDs are disposed, and the other end of the flexible PCB 20 is connected to the external driving circuit. The plurality of copper lines 28 are formed on a first surface of the flexible base film 25, and the first gold-plating pattern 32 is formed on the copper lines 28. The first gold-plating pattern 32 is positioned at both ends of the copper lines 28. An electric resistance is reduced due to the first gold-plating pattern 32. In addition, a corrosion problem of the copper lines 28 is prevented due to the first gold-plating pattern 32. The first cover layer 35, which is formed of an organic insulating material or an inorganic insulating material, for protecting the copper lines 28 is formed on the copper lines 28. The first cover layer 35 is positioned at a center of the copper lines 28 such that the first gold-plating pattern 32 is not covered with the first cover layer 35.

The copper pattern 38 is formed on a second surface of the flexible base film 25 which is opposite to the first surface of the flexible base film 25. The copper pattern 38 is positioned at one end of the base film 25. The second gold-plating pattern 40 is formed on the copper pattern 38. The second gold-plating pattern 40 covers the copper pattern 38 for preventing a corrosion problem of the copper pattern 38. The second cover layer 45 including a plurality grooves "hm" is formed on the second surface of the flexible base film 25. The second cover layer 45 covers an entire region of the second surface except a region where the second gold-plating pattern 40. The flexible PCB 20 is easily bent due to the grooves "hm".

Referring to FIG. 4, a raw flexible board 21 includes the flexible base film 25 and first and second copper layers 27 and 37 on the first and second surfaces of the flexible base film 25. When the raw flexible board 21 is processed to obtain the flexible PCB 20 (of FIG. 3), the second copper layer 37 on the second surface of the flexible base film 25 is removed, so that the copper pattern at one end of the second surface is formed and other regions of the second surface is exposed. Then, the second cover layer 45 (of FIG. 3) is formed on the other regions of the second surface and patterned to form the grooves "hm".

In the above raw flexible board 21 and the flexible PCB 20, most part of the second copper layer 37 of the raw flexible board 21 is not used for the flexible PCB 20. In addition, the second cover layer 45 is required to obtain the grooves 45. As a result, production costs for the flexible PCB 20 are increased.

SUMMARY OF THE INVENTION

Accordingly, the present invention is directed to a flexible PCB for an LED backlight unit and a method of fabricating the same that substantially obviates one or more of the problems due to limitations and disadvantages of the related art.

An object of the present invention is to provide a flexible PCB for an LED backlight unit being capable of preventing an electrical short problem.

An object of the present invention is to provide a flexible PCB for an LED backlight unit which is fabricated in decreased production costs.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a flexible printed circuit board (PCB) for a light emitting diode backlight unit includes a flexible base film; a plurality of metal lines on a first surface of the flexible base film; a cover layer on the metal lines and covering a center portion of the first surface of the flexible base film; a first gold-plating pattern on the metal lines and at both ends of the first surface of the flexible base film; a metal pattern on a second surface of the flexible base film and including a first sub-pattern at one end of the second surface, a second sub-pattern at the other end of the second surface and a plurality of third-sub patterns between the first and second sub-patterns of the metal pattern; and a second gold-plating pattern on the metal pattern and including a fourth sub-pattern on the first sub-pattern, a fifth sub-pattern on the second sub-pattern, and a plurality of sixth-sub patterns each on the third sub-patterns, wherein a first groove between a first double-layered pattern of the first sub-pattern and the fourth sub-pattern and a second double-layered pattern of the third sub-pattern and the sixth sub-pattern, a second groove between a third double-layered pattern of the second sub-pattern and the fifth sub-pattern and a second double-layered pattern of the third sub-pattern and the sixth sub-pattern, and a third groove between adjacent second double-layered patterns respectively expose a portion of the second surface of the flexible base film.

In another aspect, a method of fabricating a flexible PCB for a light emitting diode backlight unit includes etching a first metal layer on a first surface of a flexible base film to form a plurality of metal lines and a second metal layer on a second surface of the flexible base film to form a metal pattern including a first sub-pattern at one end of the second surface, a second sub-pattern at the other end of the second surface and a plurality of third-sub patterns between the first and second sub-patterns of the metal pattern; forming a cover layer by forming and patterning a cover material layer on the metal lines, the cover layer covering a center of the first surface of the flexible base film; forming a first gold-plating pattern on the metal lines and at both ends of the first surface of the flexible base film; and forming a second gold-plating pattern including a fourth sub-pattern on the first sub-pattern, a fifth sub-pattern on the second sub-pattern, and a plurality of sixth-sub patterns each on the third sub-patterns, wherein a first groove between a first double-layered pattern of the first sub-pattern and the fourth sub-pattern and a second double-layered pattern of the third sub-pattern and the sixth sub-pattern, a second groove between a third double-layered pattern of the second sub-pattern and the fifth sub-pattern and a second double-layered pattern of the third sub-pattern and the sixth sub-pattern, and a third groove between adjacent second double-layered patterns respectively expose a portion of the second surface of the flexible base film.

In another aspect, a backlight unit for a liquid crystal display module includes a reflective sheet; a light guide plate on the reflective sheet; at least on light emitting diode at a side of the light guide plate and on a printed circuit board; a flexible printed circuit board including: a flexible base film; a plurality of metal lines on a first surface of the flexible base film; a cover layer on the metal lines and covering a center portion of the first surface of the flexible base film; a first gold-plating pattern on the metal lines and at both ends of the first surface of the flexible base film; a metal pattern on a second surface of the flexible base film and including a first sub-pattern at one end of the second surface, a second sub-pattern at the other end of the second surface and a plurality of third-sub patterns between the first and second sub-patterns of the metal pattern; and a second gold-plating pattern on the metal pattern and including a fourth sub-pattern on the first sub-pattern, a fifth sub-pattern on the second sub-pattern, and a plurality of sixth-sub patterns each on the third sub-patterns; and a plurality of optical sheets over the light guide plate, wherein a first groove between a first double-layered pattern of the first sub-pattern and the fourth sub-pattern and a second double-layered pattern of the third sub-pattern and the sixth sub-pattern, a second groove between a third double-layered pattern of the second sub-pattern and the fifth sub-pattern and a second double-layered pattern of the third sub-pattern and the sixth sub-pattern, and a third groove between adjacent second double-layered patterns respectively expose a portion of the second surface of the flexible base film, and wherein an end of the flexible printed circuit board connected to the printed circuit board.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

Figure 5:
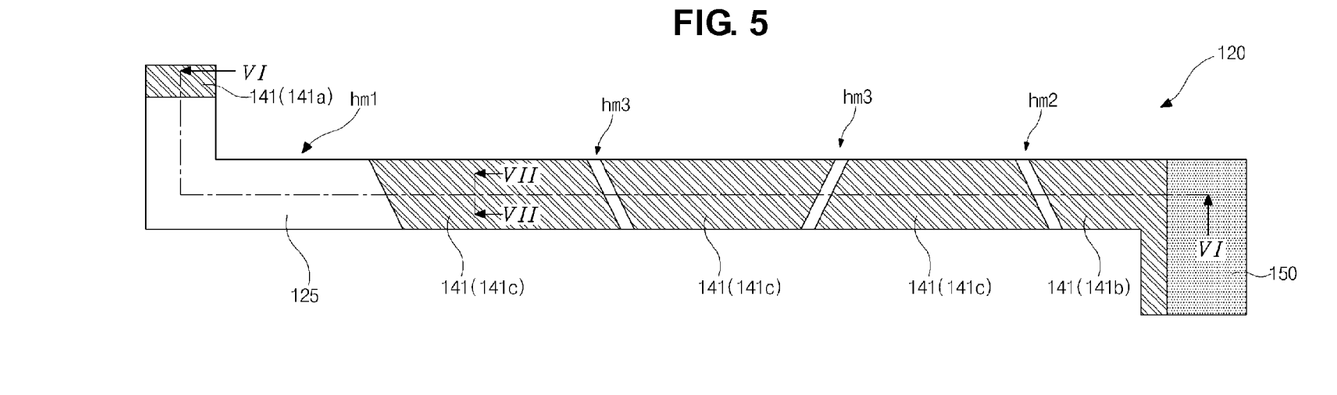
FIG. 5 is a plan view of a flexible PCB for an LED backlight unit according to the present invention.
Figure 6:
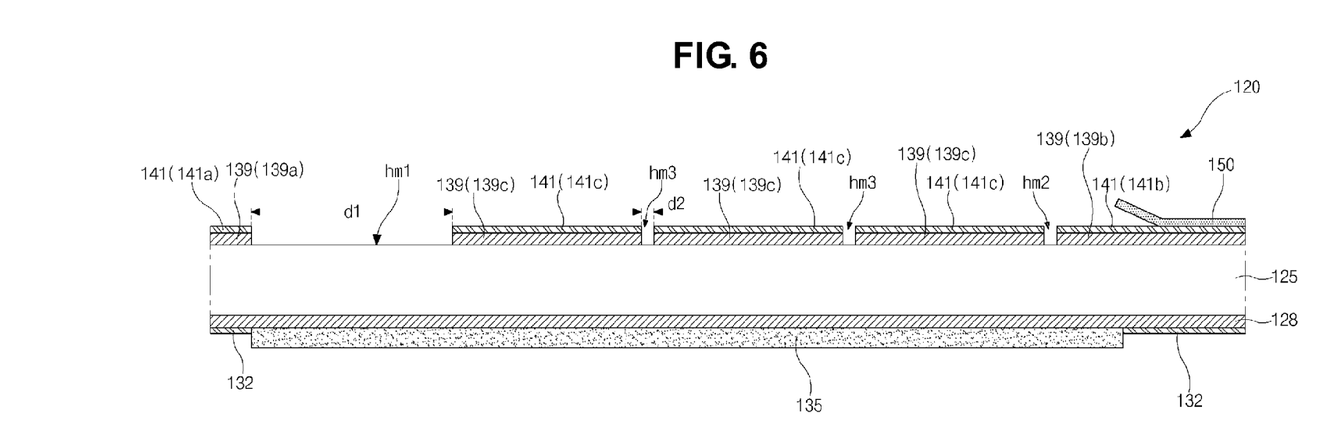
FIG. 6 is a cross-sectional view taken along the line VI-VI of FIG. 5.
Figure 7:
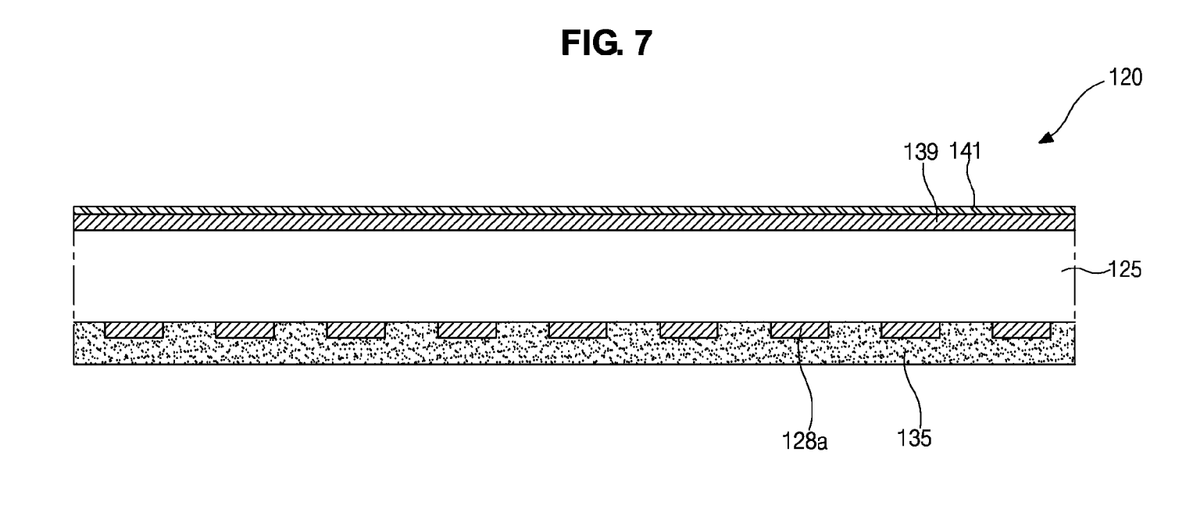
FIG. 7 is a cross-sectional view taken along the line VII-VII of FIG. 5.

FIG. 5 is a plan view of a flexible PCB for an LED backlight unit according to the present invention, FIG. 6 is a cross-sectional view taken along the line VI-VI of FIG. 5, and FIG. 7 is a cross-sectional view taken along the line VII-VII of FIG. 5.

In FIGS. 5 to 7, a flexible PCB 120 for an LED backlight unit includes a flexible base film 125, a metal line layer 128 including a plurality of metal lines 128a, a first gold-plating pattern 132, a cover layer 135, a metal pattern 139, a second gold-plating pattern 141 and a kapton tape 150. The kaptone tape 150 may be called as a polyimide tape. One end of the flexible PCB 20 is connected to the rigid PCB (not shown), where the LEDs are disposed, and the other end of the flexible PCB 120 is connected to the external driving circuit (not shown) for applying a signal to control On/Off condition of the LEDs. The metal line 128 is formed on a first surface of the flexible base film 125, and the first gold-plating pattern 132 is formed on the metal line 128. The first gold-plating pattern 132 is positioned at both ends of the metal line 128 and contacts the metal line layer 128. An electric resistance is reduced due to the first gold-plating pattern 132. In addition, a corrosion problem of the metal line layer 128 is prevented due to the first gold-plating pattern 132. The cover layer 135, which is formed of an organic insulating material or an inorganic insulating material, for protecting the metal lines 128 is formed on the metal lines 128. The cover layer 135 is positioned at a center of the first surface of the flexible base film 125 such that the first gold-plating pattern 132 is not covered with the cover layer 135.

The metal pattern 139 is disposed on a second surface of the flexible base film 125 opposite to the first surface of the flexible base film 125. The metal pattern 139 includes a first sub-pattern 139a at one end of the second surface of the flexible base film 125, a second sub-pattern 139b at the other one end of the second surface of the flexible base film 125, and a plurality of a third sub-patterns 139c between the first and second sub-patterns 139a and 139b. The second gold-plating pattern 141 is formed on the metal pattern 139. The second gold-plating pattern 141 includes a first sub-pattern 141a at one end of the second surface of the flexible base film 125, a second sub-pattern 141b at the other one end of the second surface of the flexible base film 125, and a plurality of a third sub-patterns 141c between the first and second sub-patterns 141a and 141b of the gold-plating pattern 141. The first to third sub-patterns 141a to 141c of the gold-plating pattern 141 respectively correspond to the first to third sub-patterns 139a to 139c of the metal pattern 139. In addition, the first to third sub-patterns 141a to 141c of the gold-plating pattern 141 respectively have the same shape as the first to third sub-patterns 139a to 139c of the metal pattern 139.

A first groove "hm1", which exposes a portion of the flexible base film 125, is formed between a first double-layered pattern of the first sub-pattern 139a of the metal pattern 139 and the first sub-pattern 141a of the gold-plating pattern 141 and a second double-layered pattern of one third sub-pattern 139c of the metal pattern 139 and one third sub-pattern 141c of the gold-plating pattern 141. The second double-layered pattern is closest to the first double-layered pattern. A second groove "hm2", which exposes a portion of the flexible base film 125, is formed between a third double-layered pattern of the second sub-pattern 139b of the metal pattern 139 and the second sub-pattern 141b of the gold-plating pattern 141 and a fourth double-layered pattern of another one third sub-pattern 139c of the metal pattern 139 and another one third sub-pattern 141c of the gold-plating pattern 141. The fourth double-layered pattern is closet to the third double-layered pattern. In addition, a third groove "hm3", which also exposes a portion of the flexible base film 125, is formed between adjacent double-layered patterns of one third sub-pattern 139c of the metal pattern 139 and one third sub-pattern 141c of the gold-plating pattern 141. The flexible PCB 120 is easily bent due to the first to third grooves "hm1" to "hm3". The metal pattern 139 and the second gold-plating pattern 141 have the same shape of an island. Each of the grooves "hm1" to "hm3" is positioned at a portion where the flexible PCB 120 will be bent. The kapton tape 150 is disposed on one end surface of the second sub-pattern 141b of the gold-plate pattern 141. The kapton tape 150 is positioned at one end which is inserted into the connector of the external driving circuit. The flexible PCB 120 is easily inserted into the connector of the external driving circuit due to the kapton tape 150. The kapton tape 150 may expose the end side of the second sub-pattern 141b of the gold-plating pattern 141 for an efficient contact of the connector of the external driving circuit and the second sub-pattern 141b of the gold-plating pattern 141. The kapton tape 150 has an adhesive property on a part of one surface.

The first and second gold-plating patterns 132 and 141 are positioned on the first and second surfaces of the flexible base film 125, respectively. The first and second gold-plating patterns 132 and 141 are positioned at both ends of the flexible base film 125. One end of the flexible PCB 120 is bonded with the rigid PCB, where the LEDs are disposed, for an electrical connection of the flexible PCB to the rigid PCB, and the other end of the flexible PCB 120 is inserted into a connector of the external driving circuit for an electrical connection of the flexible PCB to the external driving circuit. Namely, the first and second gold-plating patterns 132 and 141 at both ends of the flexible base film 125 with the metal lines 128a and the metal pattern 139 serve as an electrical connection of flexible PCB to the rigid PCB and the flexible PCB to the external driving circuit. The metal lines 128a and the metal pattern 139 may be formed of copper which is cheap and has a relatively low resistance. Other low resistant material, for example, aluminum or silver, may be used for the metal lines 128a and the metal pattern 139.

A first width "d1" of the first groove "hm1" is greater than a second width "d2" of the second groove "hm2" and a third width "d3" of the third groove "hm3". The second width "d2" of the second groove "hm2" and a third width "d3" of the third groove "hm3" may be equal. In FIG. 6 show the first groove "hm1" having the first width "d1", which is largest width among the first to third width "d1" to "d3", is positioned at one end of the flexible base film 125. Alternatively, the groove "hm1" may be positioned at a center of the flexible base film 125 or the other end of the flexible base film 125. The first distance "d1" may have a range within about 1 centimeter to about 3 centimeter, and the second distance "d2" may have a range within about 0.5 millimeter to about 2 millimeter. When the flexible PCB 120 is bent, there may be a contact problem between the first sub-pattern of the gold-plating pattern 141 and adjacent third sub-pattern 141c of the gold-plating pattern 141. The first groove "hm1" is larger than the other grooves "hm2" and "hm3" to prevent the contact problem. Accordingly, when the flexible PCB 120 is disposed on a rear surface of the backlight unit with being bent, there is no electrical problem.

In the present invention, the grooves are formed over the flexible base film without an additional cover layer such that production costs are reduced. In addition, most parts of metal layers on both surface of the flexible base film are used for the metal lines and metal patterns such that an electrical resistance is also reduced.

Figure 8A:
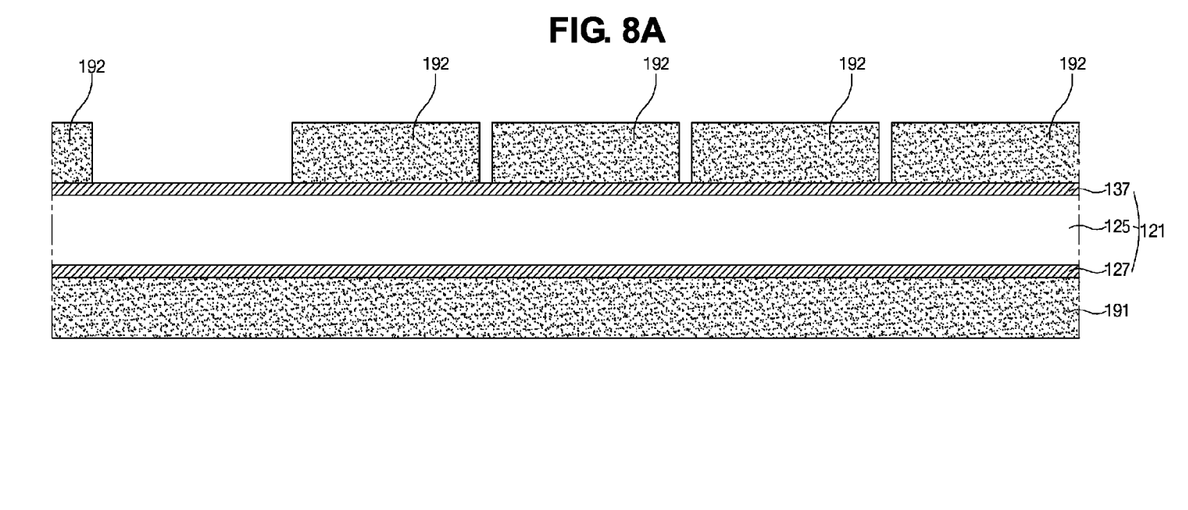
FIGS. 8A to 8F are cross-sectional views illustrating a fabricating process of a portion taken along the line VI-VI of FIG. 5.
Figure 8B:
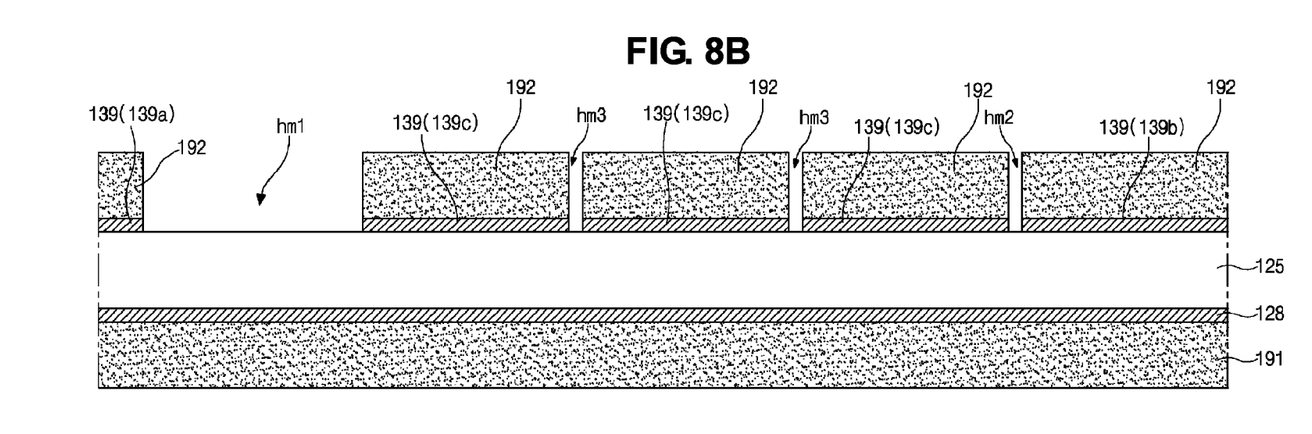
Figure 8C:
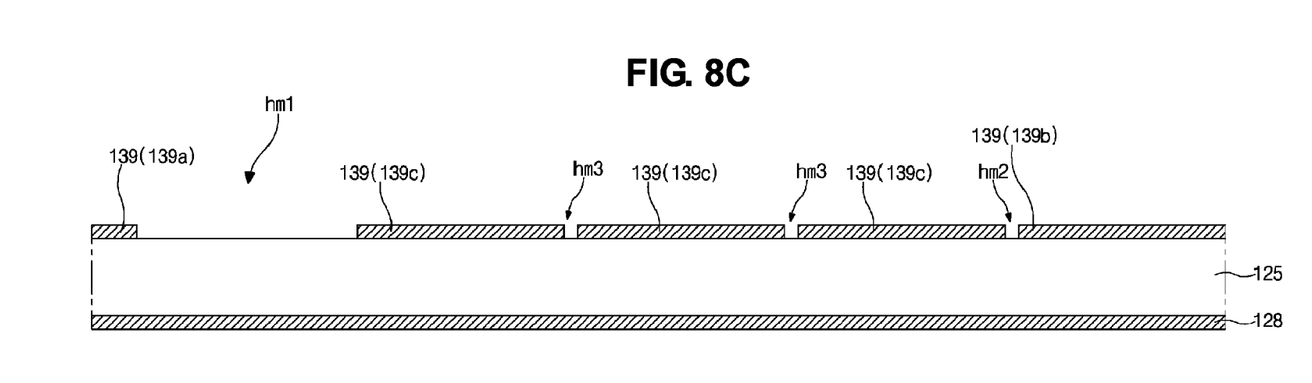
Figure 8D:
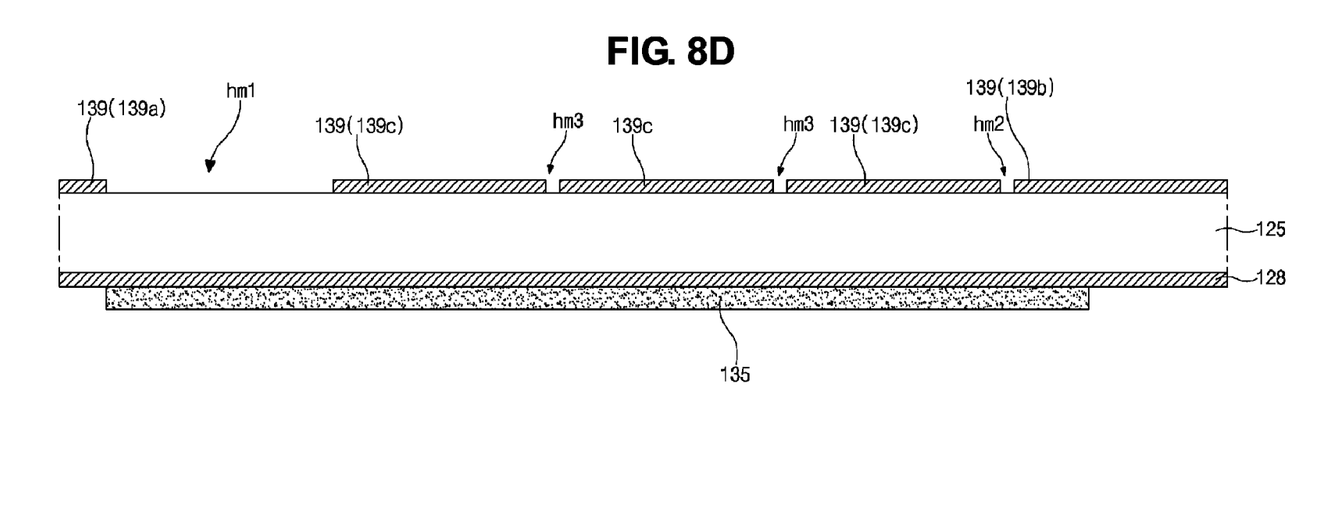
Figure 8E:
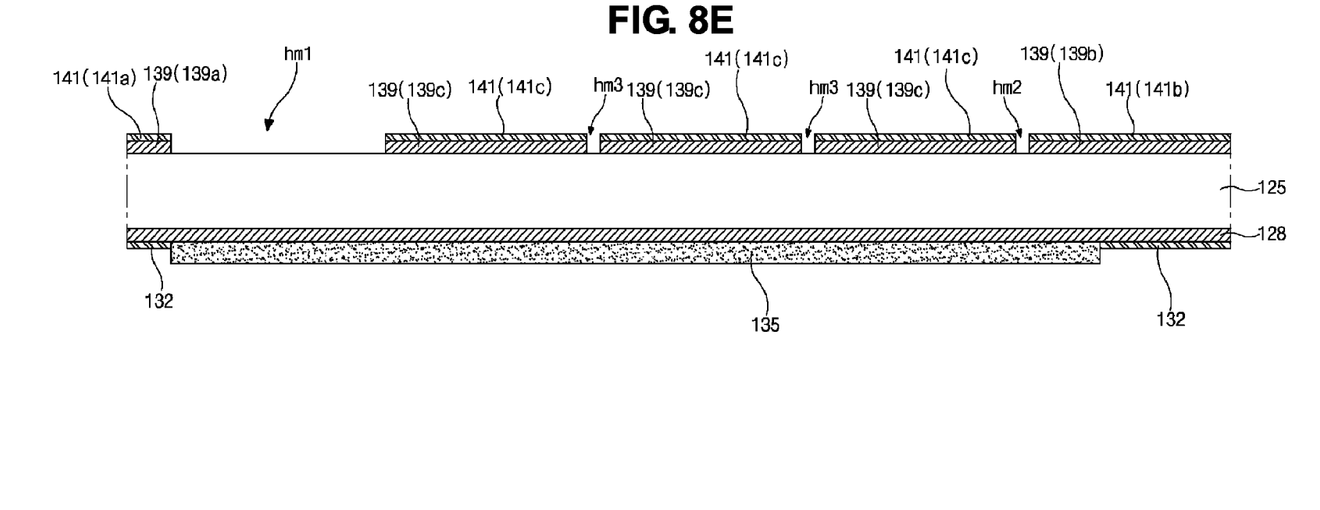
Figure 8F:
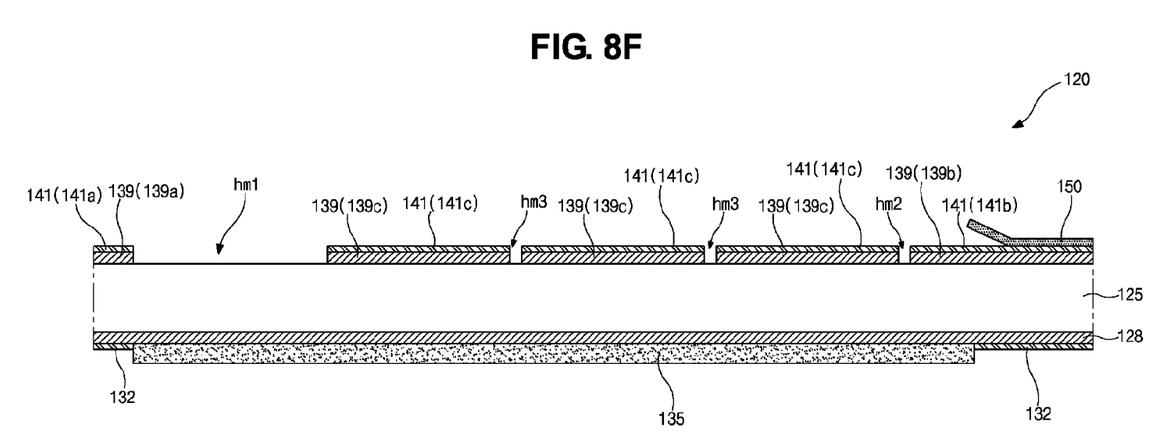
Figure 9:
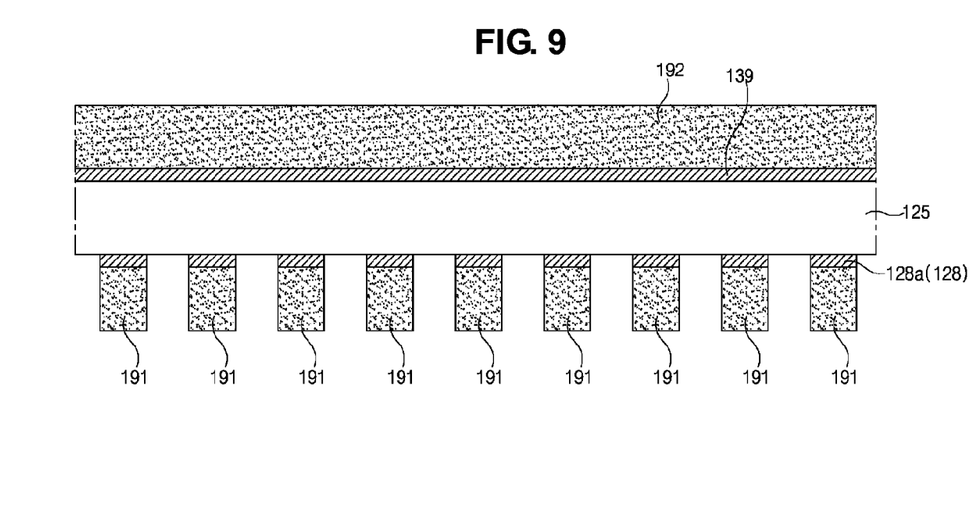
FIG. 9 is a cross-sectional view illustrating a fabricating process of a plurality of metal lines on a base film for a flexible PCB for an LED backlight unit according to the present invention.

FIGS. 8A to 8F are cross-sectional views illustrating a fabricating process of a portion taken along the line VI-VI of FIG. 5, and FIG. 9 is a cross-sectional view illustrating a fabricating process of a plurality of metal lines on a base film for a flexible PCB for an LED backlight unit according to the present invention.

Referring to FIG. 8A, a first photoresist (PR) layer (not shown) is formed on a first surface of a raw flexible board 121. First and second metal layers 127 and 137 are formed on both surfaces of the flexible base film 125, respectively, the first PR layer is positioned on the first metal layer 127. An exposing process using a mask, which has a transmissive portion and a blocking portion, and a developing process for removing a portion of the first PR layer are sequentially performed onto the first PR layer to form a first PR pattern 191. The first PR pattern 191 is positioned a region where the metal lines 128a will be formed, and the first PR layer in other region is removed such that the first metal layer 127 is exposed.

In addition, a second PR layer (not shown) is formed on the second metal layer 137. An exposing process using a mask, which has a transmissive portion and a blocking portion, and a developing process for removing a portion of the second PR layer are sequentially performed onto the second PR layer to form a second PR pattern 192. The second PR pattern 192 is positioned a region where the metal pattern 139 will be formed, and the second PR layer in other region, where the first to third grooves "hm1" to "hm3" will be formed, is removed such that the second metal layer 137 is exposed.

Referring to FIGS. 8B and 9, the first metal layer 127 (of FIG. 8A) exposed through the first PR pattern 191 and the second metal layer 137 (of FIG. 8A) exposed through the second PR pattern 192 are etched to form the metal line layer 128 including the plurality of metal lines 128a on the first surface of the flexible base film 125 and the metal pattern 139 on the second surface of the flexible base film 125. Each metal line 128a has a length same as the flexible base film 125. The metal pattern 139 includes the first sub-pattern 139a at one end of the second surface of the flexible base film 125, the second sub-pattern 139b at the other one end of the second surface of the flexible base film 125, and the plurality of a third sub-patterns 139c between the first and second sub-patterns 139a and 139b. The first to third sub-patterns 139a to 139c of the metal pattern 139 are spaced apart from one another. A space between the first sub-pattern 139a and the third sub-pattern 139c of the metal pattern 139 is defined as the first groove "hm1", and a space between the second sub-pattern 139b and the third sub-pattern 139c of the metal pattern 139 is defined as the second groove "hm2". A space between the third sub-patterns 139c of the metal pattern 139 is defined as the third groove "hm3". As mentioned above, the first width "d1" of the first groove "hm1" is greater than the second width "d2" of the second groove "hm2" and a third width "d3" of the third groove "hm3". The first distance "d1" may have a range within about 1 centimeter to about 3 centimeter, and the second distance "d2" may have a range within about 0.5 millimeter to about 2 millimeter. When the flexible PCB 120 is bent, there may be a contact problem between the first sub-pattern of the gold-plating pattern 141 and adjacent third sub-pattern 141c of the gold-plating pattern 141. The first groove "hm1" is larger than the other grooves "hm2" and "hm3" to prevent the contact problem.

Next, referring to FIG. 8C, the first PR pattern 191 (of FIG. 8B) and the second PR pattern 192 (of FIG. 8B) are removed by a stripping process.

Next, referring to FIG. 8D, the cover material layer (not shown) is formed over the first surface of the flexible base film 125 by depositing an inorganic insulating material or coating an organic insulating material. The cover material layer is patterned to form the cover layer 135 covering an entire surface of the metal line layer 128 except both ends of the metal line layer 128.

Next, referring to FIG. 8E, the flexible base film 125, where the cover layer 135, the metal line layer 128 and the metal pattern 139 are formed, is dipped into an electrolyte, which is an aqueous solution including gold-potassium cyanide and a predetermined current is applied to the aqueous solution to form the first gold-plating pattern 132 on the metal line layer 128 and the second gold-plating pattern 141 on the metal pattern 139. In the above gold-plating method, the gold is plated on the metallic material layer, such as the metal line layer 128 and the metal pattern 139, except the flexible base film 125 and the cover layer 135. As mentioned above, the second gold-plating pattern 141 includes the first sub-pattern 141a on the first sub-pattern 139a of the metal pattern 139, the second sub-pattern 141b on the second sub-pattern 139b of the metal pattern 139 and the third sub-patterns 141c on the third sub-patterns 139c of the metal pattern 139. As a result, the first to third grooves "hm1" to "hm3" still exposes portions of the flexible base film 125.

Next, referring to FIG. 8F, the kapton tape 150 is attached on the second sub-pattern 141b of the second gold-plating pattern 141, so that the flexible PCB 120 according to the present invention is obtained. The flexible PCB 120 is easily inserted into the connector of the external driving circuit due to the kapton tape 150.

In the present invention, the pattering process for the second cover layer 45, where the groove is formed, is not required, so that a fabricating process is simplified. In addition, most parts of metal layers on both surface of the flexible base film are used for the metal lines and metal patterns such that an electrical resistance is also reduced.

Although not shown, one end of the flexible PCB 120 is connected to the rigid PCB, where at least one LEDs are disposed, and the other end of the flexible PCB 120 is connected to the external driving circuit. The backlight unit includes the flexible PCB 120, the LEDs disposed on the rigid PCB, the light guide plate and the optical sheets. The reflective sheet may be disposed under the light guide plate. The light guide plate is disposed on the reflective sheet, and the rigid printed circuit board, where the LEDs are disposed, is positioned at a side of the light guide plate. Namely, the LEDs are positioned at the side of the light guide plate. The optical sheets are disposed over the light guide plate. The liquid crystal panel is disposed over the backlight unit, and the main frame, the bottom frame and the top frame are modulated with the liquid crystal panel and the backlight unit to obtain a LCD module. In more detail, the liquid crystal display panel and the backlight unit are combined using the main frame that can prevent movement of the liquid crystal panel and the backlight unit. The top frame cover edges of the liquid crystal panel and sides of the main frame, so the top frame can support and protect of the edges of the liquid crystal panel and sides of the main frame. The bottom frame covers back edges of the main frame, so the bottom frame is combined with the main frame and the top frame for modulation. The flexible PCB 120 is bent at the grooves "hm1" and "hm2" and disposed under the backlight unit, so that a compact LCD module is obtained.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A flexible printed circuit board (PCB) for a light emitting diode backlight unit, comprising:
   a flexible base film;
   a plurality of metal lines on a first surface of the flexible base film;
   a cover layer on the metal lines and covering a center portion of the first surface of the flexible base film;
   a first gold-plating pattern on the metal lines and at both ends of the first surface of the flexible base film;
   a metal pattern on a second surface of the flexible base film and including a first sub-pattern at one end of the second surface, a second sub-pattern at the other end of the second surface and a plurality of third-sub patterns between the first and second sub-patterns of the metal pattern; and
   a second gold-plating pattern on the metal pattern and including a fourth sub-pattern on the first sub-pattern, a fifth sub-pattern on the second sub-pattern, and a plurality of sixth-sub patterns each on the third sub-patterns,
   wherein a first groove between a first double-layered pattern of the first sub-pattern and the fourth sub-pattern and a second double-layered pattern of the third sub-pattern and the sixth sub-pattern, a second groove between a third double-layered pattern of the second sub-pattern and the fifth sub-pattern and a second double-layered pattern of the third sub-pattern and the sixth sub-pattern, and a third groove between adjacent second double-layered patterns respectively expose a portion of the second surface of the flexible base film.

2. The flexible PCB according to claim 1, wherein each of the metal lines and the metal pattern is formed of copper.

3. The flexible PCB according to claim 1, wherein the flexible PCB is bent at each of the grooves.

4. The flexible PCB according to claim 1, wherein the first groove is larger than each of the second and third grooves.

5. The flexible PCB according to claim 4, wherein the first distance has a range within about 1 centimeter to about 3 centimeter, and the second distance has a range within about 0.5 millimeter to about 2 millimeter.

6. The flexible PCB according to claim 1, wherein the first, second and third sub-patterns have the same shape as the fourth, fifth and sixth sub-patterns, respectively.

7. The flexible PCB according to claim 1, further comprising a kapton tape on the fifth sub-pattern and having an adhesive layer on a portion of the kapton tape.

8. A method of fabricating a flexible PCB for a light emitting diode backlight unit, comprising:
   etching a first metal layer on a first surface of a flexible base film to form a plurality of metal lines and a second metal layer on a second surface of the flexible base film to form a metal pattern including a first sub-pattern at one end of the second surface, a second sub-pattern at the other end of the second surface and a plurality of third-sub patterns between the first and second sub-patterns of the metal pattern;
   forming a cover layer by forming and pattering a cover material layer on the metal lines, the cover layer covering a center of the first surface of the flexible base film;
   forming a first gold-plating pattern on the metal lines and at both ends of the first surface of the flexible base film; and
   forming a second gold-plating pattern including a fourth sub-pattern on the first sub-pattern, a fifth sub-pattern on the second sub-pattern, and a plurality of sixth-sub patterns each on the third sub-patterns,
   wherein a first groove between a first double-layered pattern of the first sub-pattern and the fourth sub-pattern and a second double-layered pattern of the third sub-pattern and the sixth sub-pattern, a second groove between a third double-layered pattern of the second sub-pattern and the fifth sub-pattern and a second double-layered pattern of the third sub-pattern and the sixth sub-pattern, and a third groove between adjacent second double-layered patterns respectively expose a portion of the second surface of the flexible base film.

9. The method according to claim 8, wherein the step of etching the first metal layer and the second metal layer includes:
   forming a first photoresist pattern on the first metal layer and corresponding to the metal lines;
   etching the first metal layer using the first photoresist pattern as an etching mask;
   forming a second photoresist pattern on the second metal layer and corresponding to the metal pattern; and
   etching the second metal layer using the second photoresist pattern as an etching mask; and
   stripping the first and second photoresist patterns.

10. The method according to claim 8, further comprising forming a kapton tape on the fifth sub-pattern and having an adhesive layer on a portion of the kapton tape.

11. The method according to claim 8, wherein the step of forming the first gold-plating pattern and the step of forming the second gold-plating pattern includes dipping the base film into an aqueous solution including gold-potassium cyanide.

12. The method according to claim 8, wherein each of the metal lines and the metal pattern is formed of copper.

13. The method according to claim 8, wherein the first groove is larger than each of the second and third grooves.

14. The method according to claim 13, wherein the first distance has a range within about 1 centimeter to about 3 centimeter, and the second distance has a range within about 0.5 millimeter to about 2 millimeter.

15. A backlight unit for a liquid crystal display module, comprising:
   a reflective sheet;
   a light guide plate on the reflective sheet;
   at least one light emitting diode at a side of the light guide plate and on a printed circuit board;
   a flexible printed circuit board including:
      a flexible base film;
      a plurality of metal lines on a first surface of the flexible base film;

a cover layer on the metal lines and covering a center portion of the first surface of the flexible base film;

a first gold-plating pattern on the metal lines and at both ends of the first surface of the flexible base film;

a metal pattern on a second surface of the flexible base film and including a first sub-pattern at one end of the second surface, a second sub-pattern at the other end of the second surface and a plurality of third-sub patterns between the first and second sub-patterns of the metal pattern; and a second gold-plating pattern on the metal pattern and including a fourth sub-pattern on the first sub-pattern, a fifth sub-pattern on the second sub-pattern, and a plurality of sixth-sub patterns each on the third sub-patterns; and a plurality of optical sheets over the light guide plate, wherein a first groove between a first double-layered pattern of the first sub-pattern and the fourth sub-pattern and a second double-layered pattern of the third sub-pattern and the sixth sub-pattern, a second groove between a third double-layered pattern of the second sub-pattern and the fifth sub-pattern and a second double-layered pattern of the third sub-pattern and the sixth sub-pattern, and a third groove between adjacent second double-layered patterns respectively expose a portion of the second surface of the flexible base film, and wherein an end of the flexible printed circuit board connected to the printed circuit board.

* * * * *